(12) United States Patent
Liu et al.

(10) Patent No.: US 7,630,693 B2
(45) Date of Patent: Dec. 8, 2009

(54) TRANSMITTER WITH IMPROVED POWER EFFICIENCY

(75) Inventors: Lianjun Liu, Chandler, AZ (US); Ricardo A. Uscola, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 456 days.

(21) Appl. No.: 11/600,351

(22) Filed: Nov. 16, 2006

(65) Prior Publication Data
US 2008/0119214 A1 May 22, 2008

(51) Int. Cl.
*H04B 1/04* (2006.01)
(52) U.S. Cl. .................................... 455/127.1; 455/91
(58) Field of Classification Search ............... 455/91, 455/115.1, 118, 120, 127.1, 127.2, 127.3, 455/127.5
See application file for complete search history.

(56) References Cited

U.S. PATENT DOCUMENTS

| | | | | |
|---|---|---|---|---|
| 5,909,643 | A * | 6/1999 | Aihara | ............... 455/127.3 |
| 6,307,169 | B1 | 10/2001 | Sun et al. | |
| 6,307,452 | B1 | 10/2001 | Sun | |
| 6,384,353 | B1 | 5/2002 | Huang et al. | |
| 6,397,090 | B1 * | 5/2002 | Cho | ............... 455/574 |
| 6,507,475 | B1 | 1/2003 | Sun | |
| 6,625,430 | B2 * | 9/2003 | Doherty | ............... 455/126 |
| 6,706,548 | B2 | 3/2004 | Liu | |
| 6,794,101 | B2 | 9/2004 | Liu et al. | |
| 6,806,767 | B2 | 10/2004 | Dow | |
| 6,809,593 | B1 | 10/2004 | Newman et al. | |
| 7,009,454 | B2 | 3/2006 | Rategh et al. | |
| 2002/0086643 | A1 * | 7/2002 | Leipala | ............... 455/80 |
| 2005/0079825 | A1 * | 4/2005 | Omori et al. | ............... 455/67.11 |
| 2005/0143024 | A1 * | 6/2005 | Sung et al. | ............... 455/101 |
| 2005/0146379 | A1 | 7/2005 | Sugiyama et al. | |
| 2006/0009174 | A1 * | 1/2006 | Dunn | ............... 455/127.1 |
| 2007/0218849 | A1 * | 9/2007 | Harel et al. | ............... 455/127.3 |

OTHER PUBLICATIONS

De Graauw, A.J.M and Steenken, P.G., R-F MEMS for Single Line-Up Front-End Modules, Phillips Semiconductors, Nijmegen, Phillips Research, Eindhoven, The Netherlands.

(Continued)

*Primary Examiner*—Blane J Jackson
(74) *Attorney, Agent, or Firm*—Ingrassia, Fisher & Lorenz, P.C.

(57) ABSTRACT

A power amplifier (PA) line-up (210) and a method (500) for more efficiently utilizing battery power are disclosed. PA line-up (210) includes a driver (220), a matching circuit (214), and a PA (230) coupled to a matching circuit (216), wherein matching circuit (216) is configured to be coupled to a filter (260). PA line-up (210) includes a transmission line (260) coupled to matching circuit (216) and a switch (262) configured to selectively couple driver (220) to either matching circuit (214) or matching circuit (216) such that signal (205) is capable of by-passing PA (230) when signal (205) does not need to be amplified by PA (230). Furthermore, PA line-up (210) may include a second transmission line (250) so that signal (205) is capable of by-passing a driver (220) and a PA (230) when signal (205) does not need to be amplified by driver (220) and PA (230).

22 Claims, 4 Drawing Sheets

OTHER PUBLICATIONS

Fukuda, A., et al. A 0.905 GHz Wide-Range 1 W-Class Reconfigurable Power Amplifier Employing RF-MEMS Switches, NTT DoCo, Inc. Yokosuka-City, Kanagawa, Japan.

International Search Report and Written Opinion for correlating PCT Patent Application No. PCT/US07/79702 dated Apr. 23, 2008.

* cited by examiner

TRANSMITTER WITH IMPROVED POWER EFFICIENCY

FIELD OF THE INVENTION

The present invention generally relates to communication devices, and more particularly relates to power amplifier line-ups in transmitters and transceivers.

BACKGROUND

Mobile communication networks generally include base stations transmitting and receiving radio frequency (RF) signals from a plurality of mobile devices (e.g., cellular telephones). Typically, the base station instructs the cellular telephones how much power to utilize when transmitting RF signals. The base station determines the amount of power a particular cellular telephone should utilize based upon the distance the cellular telephone is from the base station. For example, the farther the cellular telephone is away from the base station, the more power the cellular telephone needs to utilize in transmitting the RF signals. Likewise, when the cellular telephone is close to the base station, the cellular telephone needs to utilize less power in transmitting the RF signals.

Cellular telephones typically include one or more power amplifier (PA) line-ups. In Global System for Mobile communications (GSM) modulation cellular telephones, there are typically two PA line-ups: one line-up for low frequency band signals (e.g., 824 megahertz (MHz) to 915 MHz), and one line-up for high frequency band signals (e.g., 1710 MHz to 1910 MHz). Current PA line-ups are designed so that they achieve maximum power added efficiency (PAE) at peak radio frequency power levels. In other words, current PA line-ups are designed to most efficiently utilize battery power when they are operating at their peak power level, which is approximately 33 dBm. For example, when operating at approximately 33 dBm, cellular telephone power amplifier modules typically have a PAE in the range of about 40-45%.

When a cellular telephone is located at a distance where the base station instructs the cellular telephone to operate at less than 33 dBm, the cellular telephone will begin to be even less efficient than the 40-45% PAE discussed above. One method of improving the PAE at medium to high power levels (e.g., >20 dBm) includes tuning the impedance of the various components within the PA line-up. However, at low power levels (e.g., <20 dBm), the PAE cannot be improved by simply impedance matching the various components within the PA line-up, which results in a low PAE at low power levels. For example, when operating at less than 15 dBm, the PAE of typical PA line-ups is approximately 1%-5%, which is significantly lower than the 40%-45% when operating at 33 dBm.

Since many cellular telephone users reside in urban areas, multiple base stations are required to accommodate the large volume of cellular telephone traffic. This results in urban areas including a relatively large number of base stations within a relatively small geographic area. Thus, for some cellular telephone users they may rarely be located far enough away from a base station to operate at their maximum power level (and maximum PAE). Accordingly, these cellular telephones will be operating at a less than optimal efficiency level the majority of the time. Moreover, it has been determined that most cellular telephones operate at their peak power level less than 5% of the time, which results in cellular telephones are outputting low levels of power (e.g., <20 dBm) greater than 95% of the time. The result of this situation is an overall low average PAE for PA line-ups and a shortened battery life for many cellular telephones. Accordingly, it is desirable to provide apparatus and methods for more efficiently utilizing battery power when a cellular telephone is operating at less than its maximum power level. Furthermore, other desirable features and characteristics will become apparent from the subsequent detailed description of the invention and the appended claims, taken in conjunction with the accompanying drawings and this background of the invention.

BRIEF DESCRIPTION OF THE DRAWINGS

The various embodiments will hereinafter be described in conjunction with the following drawing figures, wherein like numerals denote like elements.

DETAILED DESCRIPTION

The following detailed description is merely illustrative in nature and is not intended to limit the scope or application of possible embodiments. Furthermore, there is no intention to be bound by any expressed or implied theory presented in the preceding technical field, background, brief summary, or the following detailed description.

Various embodiments may be described herein in terms of functional and/or logical block networks and various processing steps. It should be appreciated that such block networks may be realized by any number of hardware, software, and/or firmware networks configured to perform the specified functions. For the sake of brevity, conventional techniques and systems related to semiconductor processing, packaging, and semiconductor devices are not treated in exhaustive detail herein.

Figure 1:
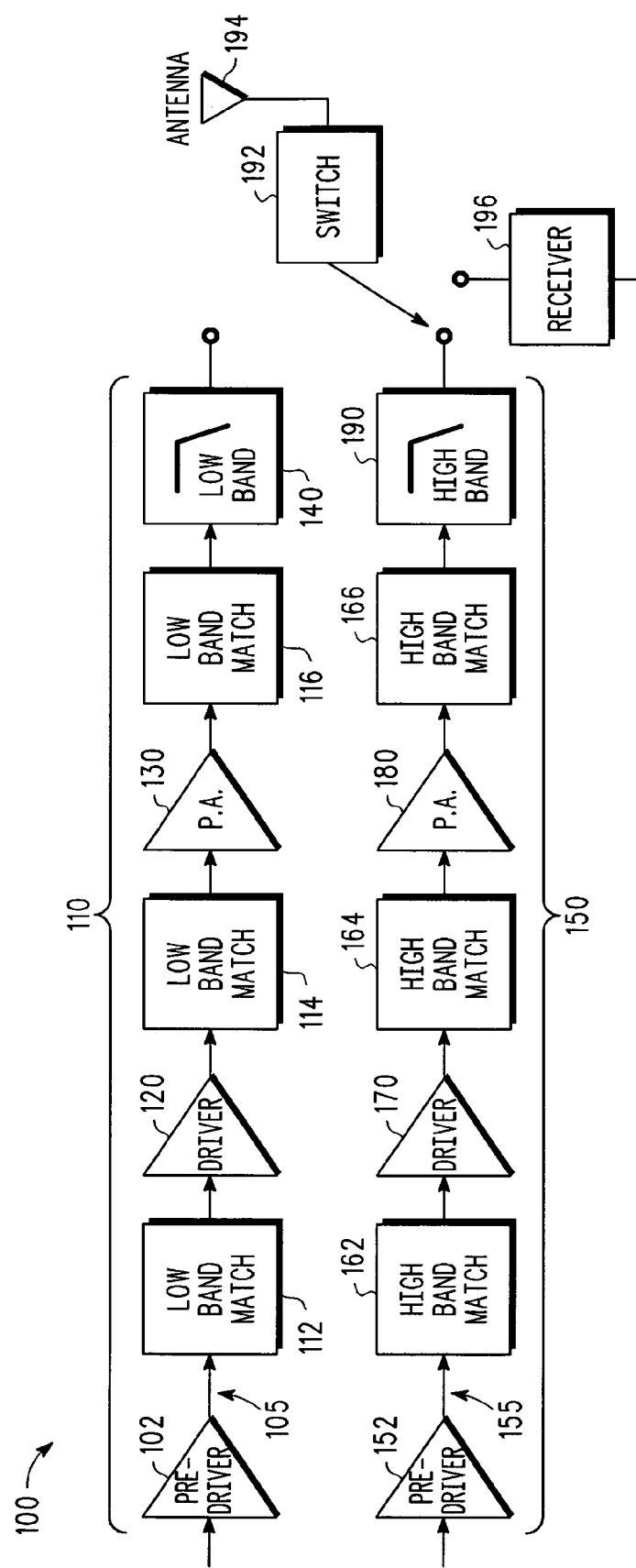
FIG. 1 is a diagram of a prior art transceiver having a dual power amplifier (PA) line-up.

As discussed above, conventional communication devices (e.g., cellular telephones) are unsatisfactory in a number of respects. With reference to FIG. 1, for example, a prior art transceiver 100 typically includes a low frequency power amplifier (PA) line-up 110 for transmitting low frequency signals (e.g., signals having a frequency of 824 MHz to 915 MHz in one embodiment) and a high frequency PA line-up 150 for transmitting high frequency signals (e.g., signals having a frequency of 1710 MHz to 1910 MHz in one embodiment).

Low frequency PA line-up 110 includes multiple low band matching circuits (e.g., low band matching circuit 112, low band matching circuit 114, and low band matching circuit 116) coupled between various system components (e.g., a pre-driver 102, a driver 120, a PA 130, and a low band filter 140, each of which is discussed below). In the example shown in FIG. 1, low band matching circuit 112 is coupled to an output of pre-driver 102 and an input of driver 120, and is configured to receive low frequency signals 105 from PA driver 102. Low band matching circuit 114 is coupled to an output of driver 120 and coupled to an input of PA 130, and low band matching circuit 116 is coupled to an output of PA 130 and coupled to an input of low band filter 140.

Similarly, high frequency PA line-up 150 also includes multiple high band matching circuits (e.g., high band matching circuit 162, high band matching circuit 164, and high band matching circuit 166) coupled between various system components (e.g., a pre-driver 152, a driver 170, a PA 180, and a high band filter 190, each of which is discussed below). As illustrated in FIG. 1, high band matching circuit 162 is coupled to the output of pre-driver 152 and an input of driver 170, and is configured to receive high frequency signals 155 from pre-driver 152. High band matching circuit 164 is coupled to an output of driver 170 and coupled to an input of PA 180, and high band matching circuit 166 is coupled to an output of PA 180 and coupled to an input of high band filter 190.

In addition, transceiver 100 includes a switch 192 coupled to an antenna 194, wherein antenna 194 typically includes an impedance requirement for transmitting signals. Furthermore, switch 192 is configured to switch between low frequency PA line-up 110, high frequency PA line-up 150, and a receiver 196.

In operation, when transceiver 100 receives a signal (not shown) from, for example, a telecommunications base station (not shown), the signal carrier instructs transceiver 100 to utilize a certain amount of power when transmitting signals to the telecommunications base station regardless of which bandwidth (i.e., low frequency PA line-up 110 or high frequency PA line-up 150) transceiver 100 is going to utilize. Once transceiver 100 receives this instruction from the telecommunications base station, transceiver 100 appropriately adjusts the amount of amplification that will occur within low frequency PA line-up 110 or high frequency PA line-up 150.

As discussed above, when transmitting at its peak power level (e.g., ~33 dBm in some embodiments), signal 105 will be amplified by each of pre-driver 102, driver 120, and PA 130 of low frequency PA line-up 110 or by each of pre-driver 152, driver 170, and PA 180 of high frequency PA line-up 150, depending upon which PA line-up is being utilized. However, when the instruction indicates that an amount of power below the peak amount is requested, the respective drivers of low frequency PA line-up 110 or high frequency PA line-up 150 (i.e., pre-driver 102, driver 120 and PA 130, and pre-driver 152, driver 170 and PA 180, respectively) are required to change their respective operating points, which results in reduced efficiency.

Figure 2:
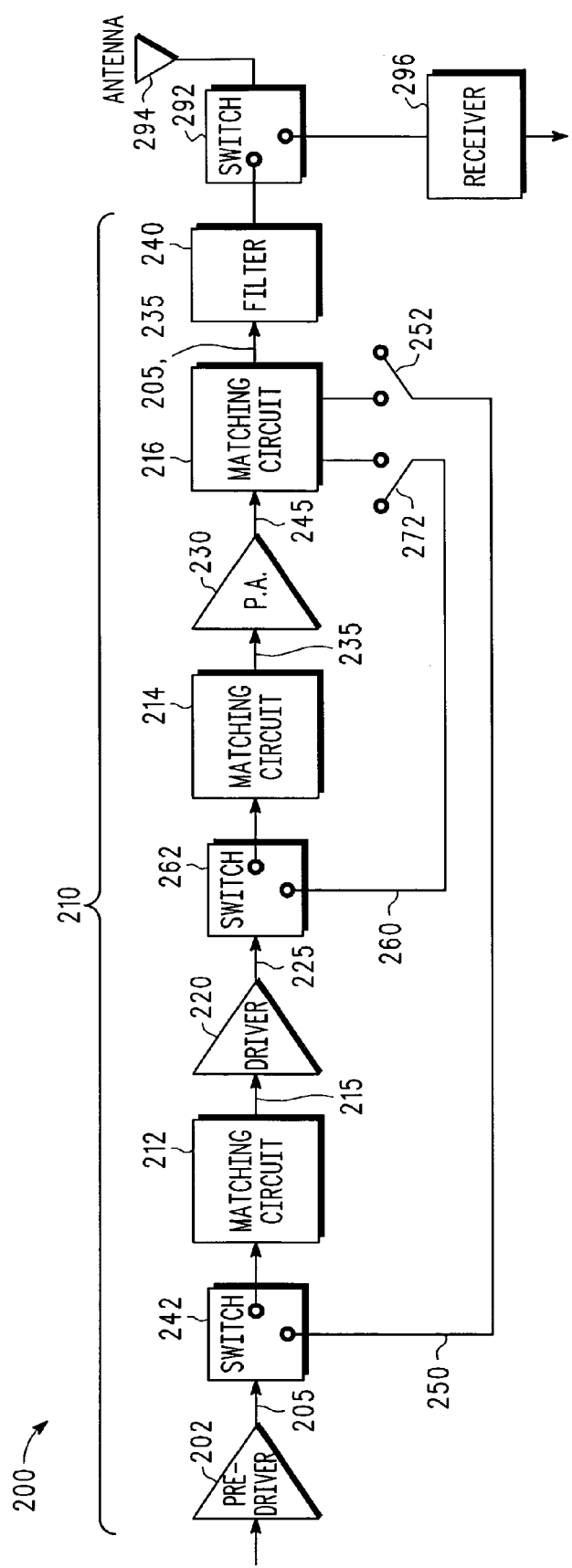
FIG. 2 is a diagram of one embodiment of a PA line-up for more efficiently utilizing battery power when operating at less than its maximum power level.

FIG. 2 is a diagram illustrating one embodiment of a transceiver 200 having at least one PA line-up 210 utilizing varying amounts of power to transmit signals to, for example, a telecommunications base station. PA line-up 210, in accordance with one embodiment, includes a plurality of matching circuits (e.g., matching circuit 212, matching circuit 214, and matching circuit 216), a plurality of drivers (e.g., pre-driver 202, driver 220, and PA 230), a plurality of transmission lines (e.g., transmission line 250 and transmission line 260), a plurality of switches (e.g., switching element 242, switching element 252, switching element 262, switching element 272, and switching element 292), and a filter 240 coupled to each other.

In the embodiment illustrated in FIG. 2, switching element 242 is configured to selectively couple an output of pre-driver 202 to an input of matching circuit 212 and an input of transmission line 250. Moreover, matching circuit 212 is coupled to an input of driver 220. Switching element 262 is coupled to an output of driver 220, and is configured to selectively couple the output of driver 220 to an input of matching circuit 214 or an input of transmission line 260. An output of matching circuit 214 is coupled to an input of PA 230, and an output of PA 230 is coupled to a first input of matching circuit 216.

Transmission line 250 includes a switching element 252 to selectively couple transmission line 250 to a second input of matching circuit 216. Furthermore, transmission line 260 includes a switching element 272 to selectively couple transmission line 260 to a third input of matching circuit 216. Moreover, an output of matching circuit 216 is coupled to an input of filter 240. In addition, transceiver 200 includes a switching element 292 to selectively couple an antenna 294 to an output of filter 240 or an input of a receiver 296.

Matching circuits 212, 214, and 216, in one embodiment, are each variably configurable to match the impedance of signals 205 between the input and output of the system components in PA line-up 210 between which they are respectively coupled. In accordance with one embodiment, matching circuits 212, 214, and 216 are each configurable to variably match the impedance of the system components with which they are respectively coupled between such that PA line-up 210 is capable of transmitting signals having varying amounts of power within at least two power levels (e.g., a low power level (e.g., <25 dBm) and a high power level (e.g., >25 dBm); or a low power level (e.g., <20 dBm), a medium power level (e.g., 20-30 dBm), and a high power level (e.g., >30 dBm)).

In one embodiment, matching circuit 212 is variably configurable to impedance match signals 205 having an amount of power less than about 20 dBm. In another embodiment, matching circuit 214 is variably configurable to impedance match signals 205 having an amount of power in the range of about 20 dBm to about 30 dBm. In yet another embodiment, matching circuit 216 is variably configurable to impedance match signals 205 having an amount of power in the range of about 10 dBm to about 35 dBm. Accordingly, matching circuit 216 is capable of impedance matching signal 205 regardless of whether signal 205 has been amplified by driver 220 and/or PA 230, or not been amplified by driver 220 and PA 230.

Notably, although matching circuits 212 and 214 are described above as being variably configurable, one embodiment contemplates that only matching circuit 216 is a variable matching circuit and neither matching circuit 212 nor matching circuit 214 are variable matching circuits. In another embodiment, matching circuit 216 and matching circuit 214 are variable matching circuits, and matching circuit 212 is not a variable matching circuit. In yet another embodiment, matching circuit 216 and matching circuit 212 are variable matching circuits, and matching circuit 214 is not a variable matching circuit. Accordingly, when matching circuit 212 and/or 214 are not variable matching circuits, these circuits do not include variable capacitive elements.

Pre-driver 202, driver 220, and PA 230 may each be any pre-driver, driver, power amplifier, or other device suitable for amplifying signals. In accordance with one embodiment, pre-driver 202, driver 220, and PA 230 are each configured to amplify a signal with differing amounts.

In accordance with one embodiment, switching elements 242, 262, and 292 are single pole, double throw switches to selectively couple the signal generator to the input of matching circuit 212 or the input of transmission line 250, selectively couple the output of driver 220 to the input of matching circuit 214 or the input to transmission line 260, and selectively couple antenna 294 to the output of filter 240 or receiver 296, respectively. In another embodiment, switching elements 252 and 272 are single pole, single throw (SPST) switches to selectively couple transmission line 250 to the second input of matching circuit 250, selectively couple transmission line 260 to the third input of matching circuit 216, respectively, when switched ON. Furthermore, various embodiments contemplate that switching elements 242, 262, and 292 may be other types of switching elements known in the art. Moreover, when each of switching elements 252 and 272 are switched OFF, matching circuit 216 is not substantially affected by the impedance of transmission line 250 and transmission line 260, respectively.

Transmission lines 250 and 260 may each be formed of any material suitable for transmitting a signal to matching circuit 216. Examples of materials for transmission lines 250 and 260 include, but are not limited to, copper, gold, aluminum, platinum, and the like. Moreover, transmission lines 250 and 260 are configured such that signals will by-pass matching circuit 212, driver 220, switching element 262, matching circuit 214, and PA 230, or by-pass matching circuit 214, and PA 230 when switching element 242 is coupled to transmission line 250 or switching element 262 is coupled to transmission line 260, respectively.

Filter 240 may be any filter or device capable allowing signals having varying amounts of power to pass through it. Examples of filter 240 include, but are not limited to, bandpass filters, high pass filters, low pass filter, and the like. In addition, antenna 294 may be any suitable antenna for transmitting and/or receiving signals and receiver 296 may be any suitable receiver.

Transceiver 200 may include one or more controllers (not shown) in communication with switching elements 242, 252, 262, 272, and/or 292 and configured to instruct each of switches to appropriately control switching elements 242, 252, 262, 272, and/or 292 in the manner discussed below. Accordingly, various embodiments of transceiver 200 contemplate that each of switching elements 242, 252, 262, 272, and 292 are controlled by the same controller, are each controlled by a different controller, or at least two switches are controlled by the same controller.

As illustrated in FIG. 2, PA line-up 210 includes both transmission line 250 and transmission line 260; however, PA line-up 210, in one embodiment, may only include one of transmission line 250 and transmission line 260. In other words, PA line-up 210, in one embodiment, includes transmission line 250, but not transmission line 260, whereas in another embodiment, PA line-up 210 includes-pass line 260, but not transmission line 250.

Notably, although transceiver 200 has been described as including PA line-up 210, various embodiments contemplate that transceiver 200 may include at least one additional PA line-up configured similar to one or more of the embodiments of PA line-up 210 discussed above. Accordingly, transceiver 200 may include a single PA line-up 210 or multiple PA line-ups 210 for signals having, for example, frequencies in different frequency bands (e.g., signals having a frequency of 824 MHz to 915 MHz and signals having a frequency of 1710 MHz to 1910 MHz).

Figure 3:
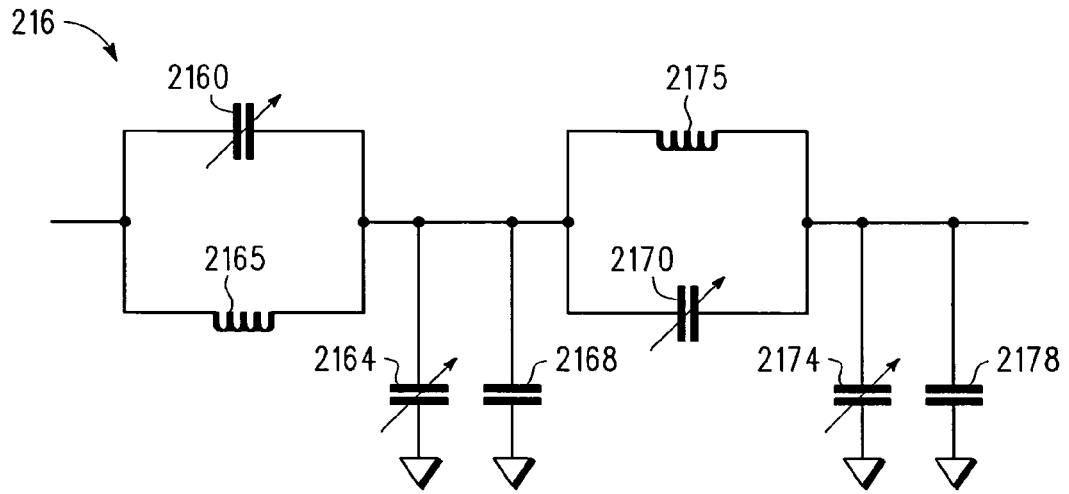
FIG. 3 is one embodiment of a matching circuit including in the PA line-up of FIG. 2.

FIG. 3 is a schematic of one embodiment of variable matching circuit 216. In the illustrated embodiment, variable matching circuit 216 includes a variable capacitive element 2160 coupled in parallel with an inductive element 2165 and a variable capacitive element 2164 coupled in parallel with a capacitive element 2168, wherein each of variable capacitive element 2164 and capacitive element 2168 are coupled to variable capacitive element 2160 and inductive element 2165. Moreover, variable matching circuit 216 includes a variable capacitive element 2170 coupled in parallel with an inductive element 2175 and a variable capacitive element 2174 coupled in parallel with a capacitive element 2178, wherein each of variable capacitive element 2174 and capacitive element 2178 are coupled to variable capacitive element 2170 and inductive element 2175.

Variable capacitive elements 2160, 2164, 2170, and 2174 may each be any device capable of variably storing charge for a given electric potential (e.g., a variable capacitor). In one embodiment, variable capacitive elements 2160, 2164, 2170, and 2174 each have a variable capacitance in the range of about 0.5 pF to about 30 pF.

In accordance with one embodiment, variable capacitive elements 2160, 2164, 2170, and 2174 are each variable micro-electro-mechanical systems (MEMS) capacitive elements. In another embodiment, variable capacitive elements 2160, 2164, 2170, and 2174 are each MEMS variable capacitive elements with separate direct current (DC) and radio frequency (RF) terminals. In yet another embodiment, variable capacitive elements 2160, 2164, 2170, and 2174 are each tunable MEMS variable capacitive elements with separate DC and RF terminals. In still another embodiment, variable capacitive elements 2160, 2164, 2170, and 2174 are each binary MEMS variable capacitive element with separate DC and RF terminals.

Capacitive elements 2168 and 2178 may each be any device capable of storing charge for a given electric potential (e.g., a capacitor). In one embodiment, capacitive elements 2168 and 2178 each have a capacitance in the range of about 0.5 picofarads (pF) to about 30 pF.

Inductive elements 2165 and 2175 may be any suitable inductor, inductive element, or device. In one embodiment, inductive elements 2165 and 2175 each include an inductance in the range of about 0.2 nanohenries (nH) to about 10 nH. Notably, variable matching circuit 216 is illustrated as having two variable capacitive elements and two inductive elements; however, various embodiments contemplate the use of any number of variable capacitive elements and/or inductive elements greater than zero to realize the re-configuration of PA line-up 210 for operation at different power levels.

In operation, a controller (not shown) switches variable capacitive elements 2160, 2164, 2170, and 2174 into ON or OFF positions depending on the need to properly match impedances of the inputs and outputs of the components with which variable matching circuit 216 is coupled to. Moreover, the same controller or a different controller switches ON and OFF switching elements 242, 252, 262, 272, and/or 292 depending on the transmitting/receiving frequency and/or power needs of the signals being transmitted or received. Accordingly, variable matching circuit 216 is capable of impedance matching for a variety of power levels.

Figure 4:
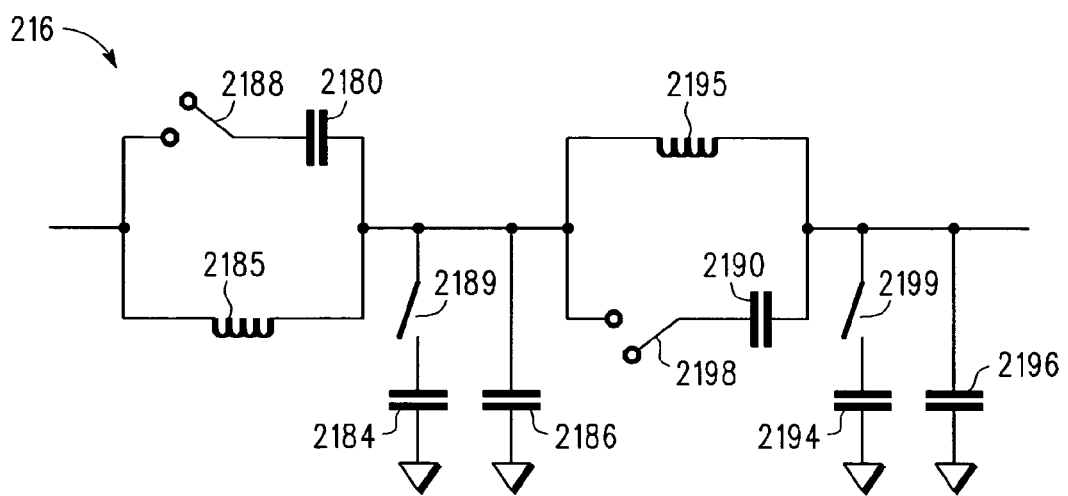
FIG. 4 is another embodiment of a matching circuit including in the PA line-up of FIG. 2.

FIG. 4 is a schematic of another embodiment of variable matching circuit 216. In the illustrated embodiment, variable matching circuit 216 includes a capacitive element 2180 coupled in parallel with an inductive element 2185, a capacitive element 2184 coupled in parallel with a capacitive element 2186, a capacitive element 2190 coupled in parallel with an inductive element 2195, and a capacitive element 2194 coupled in parallel with a capacitive element 2196. Furthermore, the embodiment illustrated in FIG. 4 includes a switching element 2188 coupled in series with capacitor 2180, a switching element 2189 coupled in series with capacitor 2184, a switching element 2198 coupled in series with capacitor 2190, and a switching element 2199 coupled in series with capacitor 2194.

As illustrated in FIG. 4, capacitive element 2180 and inductive element 2185 are each coupled to each of capacitive element 2184 (via switching element 2189) and capacitive element 2186. Furthermore, capacitive element 2190 (via switching element 2198) and inductive element 2195 are each coupled to each of capacitive element 2184 (via switching element 2189) and capacitive element 2186. Moreover, capacitive element 2190 and inductive element 2195 are each coupled to each of capacitive element 2194 (via switching element 2199) and capacitive element 2196.

Capacitive elements 2180, 2184, 2186, 2190, 2194, and 2196 may each be any device capable of storing charge for a given electric potential (e.g., a capacitor). In one embodiment, capacitive elements 2180, 2184, 2186, 2190, 2194, and 2196 each have a capacitance in the range of about 0.5 pF to about 30 pF. In another embodiment, capacitive elements 2180, 2184, 2186, 2190, 2194, and 2196 have substantially the same amount of capacitance, while in yet another embodiment, at least two of capacitive elements 2180, 2184, 2186, 2190, 2194, and 2196 have substantially different amounts of capacitance.

Inductive elements 2185 and 2195 may be any suitable inductor, inductive element, or device. In one embodiment, inductive elements 2185 and 2195 each include an inductance in the range of about 0.2 nanohenries (nH) to about 10 nH.

Switching elements 2188, 2189, 2198, and 2199 may be any device suitably configured to selectively enable current to flow through it. In accordance with one embodiment, each of switching elements 2188, 2189, 2198, and 2199 are SPST switches.

Notably, variable matching circuit 216 is illustrated as having six capacitive elements, four switching elements, and two inductive elements; however, various embodiments contemplate the use of any number of variable capacitive elements, switching elements, and/or inductive elements greater than zero to realize the re-configuration of PA line-up 210 for operation at different power levels.

In operation, a controller (not shown) switches ON or OFF switching elements 2188, 2189, 2198, and 2199 depending on the need to properly match impedances of the inputs and outputs of the components with which variable matching circuit 216 is coupled to. Moreover, the same controller or a different controller(s) switches ON and OFF switching elements 242, 252, 262, 272, and/or 292 depending on the transmitting/receiving frequency and/or power needs of the signals being transmitted or received. Accordingly, variable matching circuit 216 is capable of impedance matching for a variety of power levels.

In operation, PA line-up 210 (via pre-driver 202) receives a signal from a signal generator (not shown). When transceiver 200 is instructed to transmit a low-power signal, in one embodiment, switching element 242 selectively couples the output of pre-driver 202 to transmission line 250 and switching element 252 is switched ON such that matching circuit 216 is able to receive pre-driver output signal 205. Moreover, matching circuit 216 receives signal 205 and configures itself to impedance match signal 205 to the output of pre-driver 202 and the input of filter 240. In another embodiment, switching element 272 is switched OFF such that matching circuit 216 is not substantially affected by the impedance of transmission line 260.

When transceiver 200 is instructed to transmit a medium-power signal, in one embodiment, switching element 242 selectively couples pre-driver 202 to matching circuit 212, and switching element 262 selectively couples driver 220 to matching circuit 216. Matching circuit 212 impedance matches the output of pre-driver 202 to the input of driver 220 to produce an impedance-matched signal 215. Driver 220 receives impedance-matched signal 215 and amplifies impedance-matched signal 215 to produce an amplified, impedance-matched signal 225. Moreover, matching circuit 216 receives amplified, impedance-matched signal 225 via transmission line 260 and configures itself to impedance match amplified, impedance-matched signal 225 to the output of driver 220 and the input of filter 240. In another embodiment, switching element 252 is switched OFF such that matching circuit 216 is not substantially affected by the impedance of transmission line 250.

In one embodiment, when transceiver 200 is instructed to transmit a high-power signal, switching element 242 selectively couples pre-driver 202 to matching circuit 212 and switching element 262 selectively couples driver 220 to matching circuit 214, which is coupled to PA 230 and matching circuit 216. Matching circuit 212 impedance matches the output of pre-driver 202 to the input of driver 220 to produce impedance-matched signal 215. Driver 220 receives impedance-matched signal 215 and amplifies impedance-matched signal 215 to produce amplified, impedance-matched signal 225. Matching circuit 214 receives amplified, impedance-matched signal 225 and impedance matches amplified, impedance-matched signal 225 to produce an impedance-matched signal 235. PA 230 receives impedance-matched signal 235 and amplifies impedance-matched signal 235 to produce amplified, impedance-matched signal 245. Moreover, matching circuit 216 receives amplified, impedance-matched signal 245 and configures itself to impedance match amplified, impedance-matched signal 245 to the output of PA 230 and the input of filter 240. In another embodiment, switching element 252 and switching element 272 are switched OFF such that matching circuit 216 is not substantially affected by the impedance of transmission lines 250 and 260.

Figure 5:
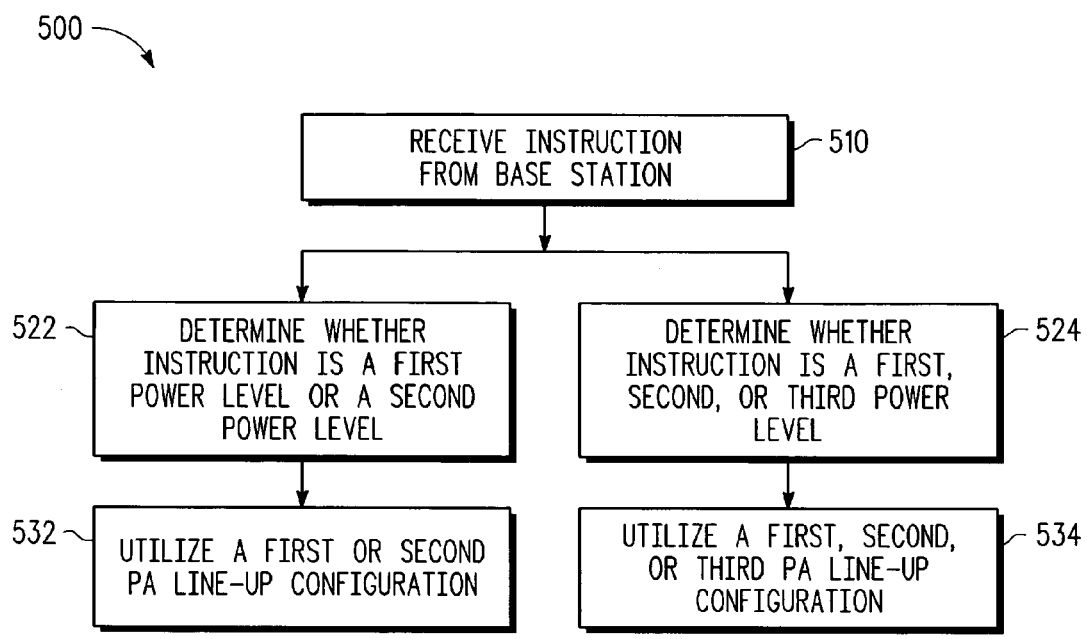
FIG. 5 is a flow diagram representing one embodiment of a method for more efficiently utilizing battery power in a PA line-up.

FIG. 5 is a flow diagram of one embodiment of a method 500 for improving power efficiency in a PA line-up (e.g., PA line-up 210) of, for example, a cellular telephone or other wireless devices. In accordance with one embodiment method 500 initiates by receiving a message from a base station instructing the cellular telephone to utilize a transmission power level when transmitting a signal to the base station (block 510).

Method 500, in one embodiment, includes determining whether the transmission power level is a first power level (e.g., less than about 25 dBm) or a second power level (e.g., greater than about 25 dBm) (block 522). In another embodiment, method 500 includes determining whether the transmission power level is a first power level (e.g., less than about 20 dBm), a second power level (e.g., 20-30 dBm), or a third power level (e.g., greater than about 30 dBm) (block 524).

In accordance with one exemplary embodiment, method 500 includes utilizing a first configuration of PA line-up 210 to transmit the signal to the base station when the first power level is determined, and utilizing a second configuration of PA line-up 210 to transmit the signal to the base station when the second power level is determined (block 532). Utilizing the first configuration, in one embodiment, includes the signal by-passing at least one driver (or PA) in PA line-up 210 when amplifying the signal. In another embodiment, utilizing the second configuration includes the signal not by-passing any drivers (or PAs).

In another exemplary embodiment, method 500 includes utilizing the first configuration of PA line-up 210 to transmit the signal to the base station when the first power level is determined, utilizing the second configuration of PA line-up 210 to transmit the signal to the base station when the second power level is determined, and utilizing a third configuration of PA line-up 210 to transmit the signal to the base station when the third power level is determined (block 534). Utilizing the first configuration, in one embodiment, includes the signal by-passing at least one driver (or PA) in PA line-up 210 when amplifying the signal. In another embodiment, utilizing the second configuration includes the signal by-passing at least two drivers (or PAs) in PA line-up 210 when amplifying the signal. In yet another embodiment, utilizing the third configuration includes the signal not by-passing any drivers (or PAs).

In summary, various embodiments provide a power amplifier (PA) line-up comprising a driver having a driver output, a PA having a PA input and a PA output, a first matching circuit having a first matching circuit output coupled to the PA input and having a first matching circuit input, the first matching circuit configured to receive a signal from the driver output and impedance match the signal to the PA input and the driver output, a second matching circuit having a second matching circuit input coupled to the PA output, a third matching circuit input, and a second matching circuit output configured to be coupled to a filter input, the second matching circuit configured to impedance match the signal to the filter input and at least one of the PA output and the driver output, a first transmission line coupled the third matching circuit input, and a first switch having a first switch output configured to selectively couple the driver to one of the first matching circuit and the second matching circuit via the first transmission line based upon a pre-determined output power level for the signal. The second matching circuit comprises a fourth matching circuit input, and the PA line-up further comprises a pre-driver having a pre-driver output, a third matching circuit having a third matching circuit output coupled to the driver input and a fifth matching circuit input, the third matching circuit configured to impedance match the signal to the pre-driver output and the driver input, a second transmission line coupled to the fourth matching circuit input, and a second switch having a second switch input coupled to the pre-driver output and a second switch output configured to selectively couple the pre-driver to one of the third matching circuit and the second matching circuit via the second transmission line based upon a pre-determined output power level for the signal, wherein the second matching circuit configured to impedance match the signal to the filter input and at least one of the driver output, the PA output, and the pre-driver output. In one embodiment, the second matching circuit is a variable matching circuit.

PA line-up, in a further embodiment, comprises a third switch configured to selectively couple the first transmission line to the third matching circuit input, wherein the third switch is configured to be open when the first switch selectively couples the driver output to the first matching circuit input and configured to be closed when the first switch selectively couples the driver output to the first transmission line. In addition, the PA line-up includes a fourth switch configured to selectively couple the second transmission line to the fourth matching circuit input, wherein the fourth-switch is configured to be open when the second switch selectively couples the pre-driver output to the fifth matching circuit input and configured to be closed when the fourth switch selectively couples the pre-driver output to the second transmission line.

In one embodiment, the PA line-up further comprises a second switch configured to selectively couple the first transmission line to the third matching circuit input, wherein the second switch is configured to be open when the first switch selectively couples the signal generator output to the first matching circuit, input and configured to be closed when the first switch selectively couples the signal generator output to the first transmission line, wherein the second matching circuit may be a variable matching circuit. Furthermore, the second matching circuit further comprises at least one variable capacitor coupled in parallel with at least one inductor. In addition, the second matching circuit further comprises at least one capacitor coupled in parallel with at least one inductor, and a second switch configured to selectively short circuit the at least one capacitor. Moreover, the second matching circuit is variable based upon whether the second matching circuit is impedance matching the one of the PA and the driver.

Other embodiments provide a PA line-up comprising a pre-driver having a pre-driver output, a driver having a driver input and a driver output, a first matching circuit having a first matching circuit output coupled to the driver input and having a first matching circuit input, the first matching circuit configured to receive a signal from the pre-driver output and impedance match the signal to the first driver input and the pre-driver output, a PA having a PA input and a PA output, a second matching circuit having a second matching circuit input coupled to the driver output and having a second matching circuit output coupled to the PA output, the second matching circuit configured to receive the signal from the driver output and impedance match the signal to the driver output and the PA input, a third matching circuit having a third matching circuit input coupled to the PA output, a fourth matching circuit input, and a third matching circuit output configured to be coupled to a filter input, the third matching circuit configured to impedance match the signal to the filter input and at least one of the PA output and the pre-driver output a transmission line coupled the fourth matching circuit input, and a first switch having a first switch input coupled to the pre-driver output, wherein the first switch is configured to selectively couple the pre-driver to one of the first matching circuit and the third matching circuit via the transmission line based upon a pre-determined output power level for the signal. In one embodiment, the PA line-up further comprises a second switch configured to selectively couple the transmission line to the fourth matching circuit input, wherein the second switch is configured to be open when the first switch selectively couples the pre-driver to the first matching circuit and configured to be closed when the first switch selectively couples the pre-driver to the third matching circuit via the transmission line.

In addition, a method is provided for operating a PA line-up of a wireless device, the method comprising receiving a message from a base station instructing the wireless device to utilize a transmission power level when transmitting a signal to the base station, determining whether the transmission power level is one of a first power level and a second power level, utilizing a first configuration of a power amplifier line-up to transmit the signal to the base station when the first power level is determined, and utilizing a second configuration of the power amplifier line-up to transmit the signal to the base station when the second power level is determined. In one embodiment, utilizing the first configuration comprises by-passing at least one driver in the PA line-up when amplifying the signal. In another embodiment, utilizing the first configuration further comprises impedance matching a filter input to one of a pre-driver output, a driver output, and a power amplifier output.

In addition, impedance matching comprises utilizing a MEMS capacitor in a variable-matching circuit to impedance match the filter input to the one of the pre-driver output, the driver output, and the power amplifier output. Furthermore, impedance matching comprises utilizing a switch coupled in series with capacitor in a variable matching circuit to impedance match the filter input to the one of the pre-driver output, the driver output, and the power amplifier output. Moreover, impedance matching comprises impedance matching differing amounts of impedance based upon whether the filter input is being impedance matched to one of the pre-driver output, the driver output, and the power amplifier output.

In one embodiment, determining comprises determining whether the transmission power level is one of a first power level, a second power level, and a third power level, the method further comprising utilizing a third configuration of the power amplifier line-up to transmit the signal to the base station when the third power level is determined. In addition, utilizing the first configuration comprises the signal by-passing at least one driver in the PA line-up when amplifying the signal. Furthermore, utilizing the second configuration comprises the signal by-passing at least two drivers in the PA line-up when amplifying the signal. Moreover, utilizing the third configuration comprises amplifying the signal utilizing at least two drivers in the PA line-up.

While at least one embodiment has been presented in the foregoing detailed description, it should be appreciated that a vast number of variations exist. It should also be appreciated that the embodiment or embodiments are only examples, and are not intended to limit the scope, applicability, or configuration in any way. Rather, the foregoing detailed description will provide those skilled in the art with a convenient road map for implementing an embodiment of the invention, it being understood that various changes may be made in the function and arrangement of elements described in an embodiment without departing from the scope as set forth in the appended claims and their legal equivalents.

We claim:

1. A power amplifier (PA) line-up comprising:
   a driver having a driver output;
   a PA having a PA input and a PA output;
   a first matching circuit having a first matching circuit output coupled to the PA input and having a first matching circuit input, the first matching circuit configured to receive a signal from the driver output and impedance match the signal to the PA input and the driver output;
   a second matching circuit having a second matching circuit input coupled to the PA output, a third matching circuit input, and a second matching circuit output configured to be coupled to a filter input, the second matching circuit configured to impedance match the signal to the filter input and at least one of the PA output and the driver output;
   a first transmission line coupled to the third matching circuit input; and
   a first switch coupled to the driver output, the first switch having a first switch output configured to selectively couple the driver to one of the second matching circuit via the first transmission line and the first matching circuit based upon a pre-determined output power level for the signal.

2. The PA line-up of claim 1, wherein the second matching circuit comprises a fourth matching circuit input, the PA line-up further comprising:
   a pre-driver having a pre-driver output;
   a third matching circuit having a third matching circuit output coupled to the driver input and a fifth matching circuit input, the third matching circuit configured to impedance match the signal to the pre-driver output and the driver input;
   a second transmission line coupled to the fourth matching circuit input; and
   a second switch having a second switch input coupled to the pre-driver output and a second switch output configured to selectively couple the pre-driver to one of the third matching circuit and the second matching circuit via the second transmission line based upon a pre-determined output power level for the signal, wherein the second matching circuit is configured to impedance match the signal to the filter input and at least one of the driver output, the PA output, and the pre-driver output.

3. The PA line-up of claim 2, further comprising a third switch configured to selectively couple the first transmission line to the third matching circuit input, wherein the third switch is configured to be open when the first switch selectively couples the driver output to the first matching circuit input and configured to be closed when the first switch selectively couples the driver output to the first transmission line.

4. The PA line-up of claim 3, further comprising a fourth switch configured to selectively couple the second transmission line to the fourth matching circuit input, wherein the fourth switch is configured to be open when the second switch selectively couples the pre-driver output to the fifth matching circuit input and configured to be closed when the fourth switch selectively couples the pre-driver output to the second transmission line.

5. The PA line-up of claim 2, wherein the second matching circuit is a variable matching circuit.

6. The PA line-up of claim 1, further comprising a second switch configured to selectively couple the first transmission line to the third matching circuit input, wherein the second switch is configured to be open when the first switch selectively couples the signal generator output to the first matching circuit input and configured to be closed when the first switch selectively couples the signal generator output to the first transmission line.

7. The PA line-up of claim 1, wherein the second matching circuit is a variable matching circuit.

8. The PA line-up of claim 7, wherein the second matching circuit further comprises at least one variable capacitor coupled in parallel with at least one inductor.

9. The PA line-up of claim 7, wherein the second matching circuit further comprises at least one capacitor coupled in parallel with at least one inductor, and a second switch configured to selectively short circuit the at least one capacitor.

10. The PA line-up of claim 7, wherein the second matching circuit is variable based upon whether the second matching circuit is impedance matching the one of the PA and the driver.

11. The PA line-up of claim 7, wherein the second matching circuit further comprises:
    a first node;
    a second node;
    a first variable capacitor coupled to the first node and the second node;
    a first inductor coupled to the first node and the second node, and coupled in parallel with the first variable capacitor;
    a third node coupled to the second node;
    a second variable capacitor coupled to the third node and configured to be coupled to ground;
    a fourth node coupled to the third node; and
    a first capacitor coupled to the fourth node and configured to be coupled to ground.

12. The PA line-up of claim 11, wherein the second matching circuit further comprises:
    a fifth node coupled to the fourth node;
    a sixth node;
    a third variable capacitor coupled to the fifth node and the sixth node;
    a second inductor coupled to the fifth node and the sixth node, and coupled in parallel with the third variable capacitor;

a seventh node coupled to the sixth node;
a fourth variable capacitor coupled to the seventh node and configured to be coupled to ground;
an eighth node coupled to the seventh node; and
a second capacitor coupled to the eighth node and configured to be coupled to ground.

13. The PA line-up of claim 7, wherein the second matching circuit further comprises:
a first node;
a second node;
a first switch coupled to the first node;
a first capacitor coupled in series with the first switch and coupled to the second node;
a first inductor coupled to the first node and the second node, and coupled in parallel with the first switch and the first capacitor;
a third node coupled to the second node;
a second switch coupled to the third node;
a second capacitor coupled to the second switch and configured to be coupled to ground;
a fourth node coupled to the third node; and
a third capacitor coupled to the fourth node and configured to be coupled to ground.

14. The PA line-up of claim 13, wherein the second matching circuit further comprises:
a fifth node coupled to the fourth node;
a sixth node;
a third switch coupled to the fifth node;
a fourth capacitor coupled in series with the third switch and coupled to the sixth node;
a second inductor coupled to the fifth node and the sixth node, and coupled in parallel with the third switch and the fourth capacitor;
a seventh node coupled to the sixth node;
a fourth switch coupled to the seventh node;
a fifth capacitor coupled to the fourth switch and configured to be coupled to ground;
an eighth node coupled to the seventh node; and
a sixth capacitor coupled to the eighth node and configured to be coupled to ground.

15. A power amplifier (PA) line-up comprising:
a pre-driver having a pre-driver output;
a driver having a driver input and a driver output;
a first matching circuit having a first matching circuit output coupled to the driver input and having a first matching circuit input, the first matching circuit configured to receive a signal from the pre-driver output and impedance match the signal to the first driver input and the pre-driver output;
a PA having a PA input and a PA output;
a second matching circuit having a second matching circuit input coupled to the driver output and having a second matching circuit output coupled to the PA input, the second matching circuit configured to receive the signal from the driver output and impedance match the signal to the driver output and the PA input;
a third matching circuit having a third matching circuit input coupled to the PA output, a fourth matching circuit input, and a third matching circuit output configured to be coupled to a filter input, the third matching circuit configured to impedance match the signal to the filter input and at least one of the PA output and the pre-driver output;
a transmission line coupled to the fourth matching circuit input; and
a first switch having a first switch input coupled to the pre-driver output, wherein the first switch is configured to selectively couple the pre-driver to one of the third matching circuit via the transmission line and the first matching circuit based upon a pre-determined output power level for the signal.

16. The PA line-up of claim 15, further comprising a second switch configured to selectively couple the transmission line to the fourth matching circuit input, wherein the second switch is configured to be open when the first switch selectively couples the pre-driver to the first matching circuit and configured to be closed when the first switch selectively couples the pre-driver to the third matching circuit via the transmission line.

17. The PA line-up of claim 15, wherein the third matching circuit further comprises at least one variable capacitor coupled in parallel with at least one inductor.

18. The PA line-up of claim 15, wherein the third matching circuit further comprises at least one capacitor coupled in parallel with at least one inductor, and a second switch configured to selectively short circuit the at least one capacitor.

19. The PA line-up of claim 15, wherein the third matching circuit further comprises:
a first node;
a second node;
a first variable capacitor coupled to the first node and the second node;
a first inductor coupled to the first node and the second node, and coupled in parallel with the first variable capacitor;
a third node coupled to the second node;
a second variable capacitor coupled to the third node and configured to be coupled to ground;
a fourth node coupled to the third node; and
a first capacitor coupled to the fourth node and configured to be coupled to ground.

20. The PA line-up of claim 19, wherein the third matching circuit further comprises:
a fifth node coupled to the fourth node;
a sixth node;
a third variable capacitor coupled to the fifth node and the sixth node;
a second inductor coupled to the fifth node and the sixth node, and coupled in parallel with the third variable capacitor;
a seventh node coupled to the sixth node;
a fourth variable capacitor coupled to the seventh node and configured to be coupled to ground;
an eighth node coupled to the seventh node; and
a second capacitor coupled to the eighth node and configured to be coupled to ground.

21. The PA line-up of claim 15, wherein the third matching circuit further comprises:
a first node;
a second node;
a first switch coupled to the first node;
a first capacitor coupled in series with the first switch and coupled to the second node;
a first inductor coupled to the first node and the second node, and coupled in parallel with the first switch and the first capacitor;
a third node coupled to the second node;
a second switch coupled to the third node;
a second capacitor coupled to the second switch and configured to be coupled to ground;
a fourth node coupled to the third node; and
a third capacitor coupled to the fourth node and configured to be coupled to ground.

22. The PA line-up of claim 21, wherein the third matching circuit further comprises:
- a fifth node coupled to the fourth node;
- a sixth node;
- a third switch coupled to the fifth node;
- a fourth capacitor coupled in series with the third switch and coupled to the sixth node;
- a second inductor coupled to the fifth node and the sixth node, and coupled in parallel with the third switch and the fourth capacitor;
- a seventh node coupled to the sixth node;
- a fourth switch coupled to the seventh node;
- a fifth capacitor coupled to the fourth switch and configured to be coupled to ground;
- an eighth node coupled to the seventh node; and
- a sixth capacitor coupled to the eighth node and configured to be coupled to ground.

* * * * *

UNITED STATES PATENT AND TRADEMARK OFFICE
CERTIFICATE OF CORRECTION

PATENT NO. : 7,630,693 B2 Page 1 of 1
APPLICATION NO. : 11/600351
DATED : December 8, 2009
INVENTOR(S) : Liu et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 478 days.

Signed and Sealed this

Second Day of November, 2010

David J. Kappos
*Director of the United States Patent and Trademark Office*